United States Patent [19]
Lagues

[11] Patent Number: 5,827,802
[45] Date of Patent: *Oct. 27, 1998

[54] METHOD OF DEPOSITING MONOMOLECULAR LAYERS

[75] Inventor: Michel Lagues, Fontenay-Aux-Roses, France

[73] Assignee: Ufinnova, Paris, France

[ * ] Notice: This patent issued on a continued prosecution application filed under 37 CFR 1.53(d), and is subject to the twenty year patent term provisions of 35 U.S.C. 154(a)(2).

[21] Appl. No.: 640,815

[22] PCT Filed: Nov. 10, 1994

[86] PCT No.: PCT/FR94/01321

§ 371 Date: Jul. 8, 1996

§ 102(e) Date: Jul. 8, 1996

[87] PCT Pub. No.: WO95/13409

PCT Pub. Date: May 18, 1995

[30] Foreign Application Priority Data

Nov. 12, 1993 [FR] France ................................ 93 13511

[51] Int. Cl.$^6$ .................................................. H01L 39/24
[52] U.S. Cl. ......................... 505/473; 427/8; 427/126.3; 427/250; 427/255.3; 427/255.7; 427/377; 117/108
[58] Field of Search ........................... 427/8, 126.3, 250, 427/255.3, 255.7, 377; 117/108; 505/473

[56] References Cited

U.S. PATENT DOCUMENTS 4,988,670  1/1991  Itozaki et al. ................................. 505/1

FOREIGN PATENT DOCUMENTS 2093729  10/1993  Canada .
2211209  6/1989  United Kingdom .

OTHER PUBLICATIONS

Schuhl et al., Physica C, vol. 162–164, Dec. 1989, pp. 627–628.

Lagues et al., Physics and Chemistry of Molecular and Oxide Superconductors. Satellite Conference to LT20, Eugene, OR, Jul. 27–31, 1993, as disclosed in Journal of Superconductivity, Feb. 1994, pp. 221–225.

*Primary Examiner*—Shrive Beck
*Assistant Examiner*—Timothy Meeks
*Attorney, Agent, or Firm*—Larson & Taylor

[57] ABSTRACT

Method of vacuum depositing a monomolecular layer on a surface, the monomolecular layer comprising at least one element selected from groups IIa, IIIa, IVa, VIIIa, Ib, IIb, IIIb, Vb of the periodic table. The method consists in heating said surface to a predetermined temperature (T) of less than 600° C. and vacuum evaporating at least the above-mentioned element for the purpose of depositing it on the receptor surface, the total atomic flow of the element(s) onto the receptor surface being from $10^{12}$ to $10^{15}$ atoms/cm$^2$s. According to the invention, the formation of the monomolecular layer is monitored in real time, and evaporation of the element is stopped when the complete formation of the monomolecular layer is detected.

4 Claims, 1 Drawing Sheet

METHOD OF DEPOSITING MONOMOLECULAR LAYERS

FIELD OF THE INVENTION

The present invention relates to a method of vacuum depositing a monomolecular layer on a host surface, this monomolecular layer including at least one element chosen from groups IIa, IIIa, IVa, VIIIa, Ib, IIb, IIIb, Vb of the Periodic Table of the Elements or an element capable of exhibiting a mixed valency, said method including the steps consisting in heating the host surface to a predetermined temperature below 600° C. and in vacuum evaporating at least the abovementioned element in order to deposit it on the host surface, the total atomic flux of the abovementioned element or elements arriving on said surface being adjusted between $10^{12}$ and $10^{15}$ atoms/cm$^2$. s.

As used in this context, the term "monomolecular layer" indicates a layer consisting of a single thickness of the atoms or molecules constituting said layer.

BACKGROUND OF THE INVENTION

A method as defined above has been described, in particular, by Schuhl et al. [Physica C 162–164 (1989), pages 627–628, Elsevier North-Holland].

It has been found in practice that the formation of a strictly monomolecular layer is extremely difficult because the element which is deposited on the host surface naturally tends to form three-dimensional aggregates, that is to say aggregates having a thickness consisting of a plurality of superposed layers of the chemical species which normally constitute the monomolecular layer. This is because three-dimensional aggregates are energetically more stable than a strictly monomolecular layer.

The formation of such aggregates is in general irreversible and it has detrimental consequences on the properties of the material formed by deposition on the host surface, in particular, but not exclusively, when said material is a superconducting material.

Furthermore, when a plurality of monomolecular layers are deposited successively one on top of the other, the formation of a three-dimensional aggregate on one layer also promotes the appearance of such aggregates on the following layers, so that the properties of the following layers are also interfered with.

The object of the present invention is, in particular, to avoid these drawbacks.

SUMMARY OF THE INVENTION

Thus, according to the present invention, a method of the type in question is essentially characterized in that the formation of the monomolecular layer is monitored in real time, and in that the evaporation of the element is stopped when the complete formation of the monomolecular layer is detected.

Of course, this method makes it possible to successively deposit a plurality of identical monomolecular layers, in which case the evaporation of the element deposited is only stopped when the deposition of the last monomolecular layer is stopped, this last layer constituting the abovementioned monomolecular layer.

Controlling the temperature of the host surface and the flux of the deposited element arriving on this host surface makes it possible to avoid the appearance of three-dimensional atom aggregates during the formation of the monomolecular layer.

The atom flux of the element deposited on the host surface should in general be between a minimum value, below which a monoatomic layer cannot be formed, and a maximum value above which the formation of three-dimensional atom aggregates which prevent the formation of a strictly monoatomic layer is unavoidable. These minimum and maximum values are experimentally determined for each element to be deposited, in accordance with its particular growth mechanism.

Furthermore, stopping the evaporation of the element deposited as soon as the monomolecular layer is completed makes it possible to avoid the formation of three-dimensional atomic aggregates due to an excess of said deposited element.

In advantageous embodiments, one and/or other of the following arrangements is/are employed:
  the formation of the monomolecular layer is monitored by reflection high-energy electron diffraction (RHEED), while measuring the intensity of the electron diffraction lines, the complete formation of the monomolecular layer being detected when said intensity reaches a second extremum after passing through a first extremum during the formation of the monomolecular layer;
  the monomolecular layer further includes oxygen, which is incorporated in said monomolecular layer during the deposition of the abovementioned element, while creating a local atomic oxygen pressure of between $10^{-6}$ and 10 Pa in the vicinity of the host surface;
  the local atomic oxygen pressure is between $10^{-5}$ and 10 Pa, and a molecular oxygen pressure of between $10^{-4}$ and 100 Pa is created in the vicinity of the host surface at the same time as this atomic oxygen pressure is created;
  the predetermined temperature of the host surface is at least equal to 300° C.;
  the element chosen from groups IIa, IIIa, IVa, VIIIa, Ib, IIb, IIIb, Vb is chosen from: Ca, Cu, Bi, Tl, Hg, Sr, or from the lanthanide series;
  a plurality of monomolecular layers are successively deposited on a substrate;
  the set of monomolecular layers deposited on the substrate forms a superconducting film;
  the heating takes place to a temperature of between 100 and 300° C.

BRIEF DESCRIPTION OF THE DRAWINGS

Other characteristics and advantages of the method according to the invention will emerge from the following description of a preferred embodiment, given by way of nonlimiting example with reference to the appended drawings.

In the drawings.

DETAILED DESCRIPTION OF THE INVENTION

Figure 1:
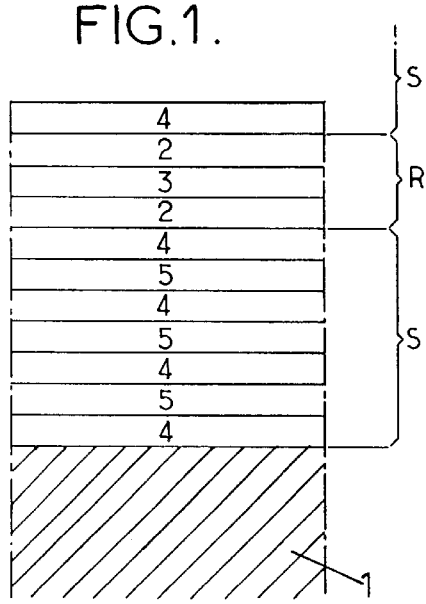
FIG. 1 is a schematic sectional view representing a superconducting material which can be obtained by virtue of the method according to the invention.

The method according to the invention will be described hereafter with reference to a particular application case in which it is used to produce a superconducting material which is in the form of a multilayer film deposited on a perfectly polished substrate 1, preferably a monocrystal of strontium titanate ($SrTiO_3$) or, if appropriate, magnesium oxide (MgO), or any other substrate.

The film which is deposited on the substrate 1 consists of mutually superposed monomolecular layers.

These monomolecular layers are distributed into two types of assemblies: electric charge reservoirs R, which in the example represented each consist of three successive layers 2, 3, 2, and superconducting cells S, which consist of a certain number n of superconducting layers 4 separated in pairs by intermediate layers 5, being equal to 4 in the example represented, although n may be greater than 4.

The multilayer film deposited on the substrate 1 generally includes a plurality of superconducting cells S and a plurality of charge reservoirs R alternately superposed.

The number n of superconducting layers 4 contained in a superconducting cell may, if appropriate, differ from one superconducting cell S to another.

In this particular case, the superconducting layers 4 consist of a copper oxide of chemical formula $CuO_2$, and the intermediate layers 5 are of chemical formula $Ca_{1-x}Bi_x$, x being a real number greater than or equal to 0 and less than or equal to 0.2, the intermediate layers being, if appropriate, incomplete.

Furthermore, still in the particular case described, each charge reservoir R consists of two layers 2 consisting of a calcium oxide, which are separated by a layer 3 consisting of a metal oxide, it being possible for the metal in this oxide to be bismuth, mercury or thallium, bismuth being preferred.

According to the invention, the technique referred to as molecular beam epitaxy (MBE) is used to produce this material.

Figure 2:
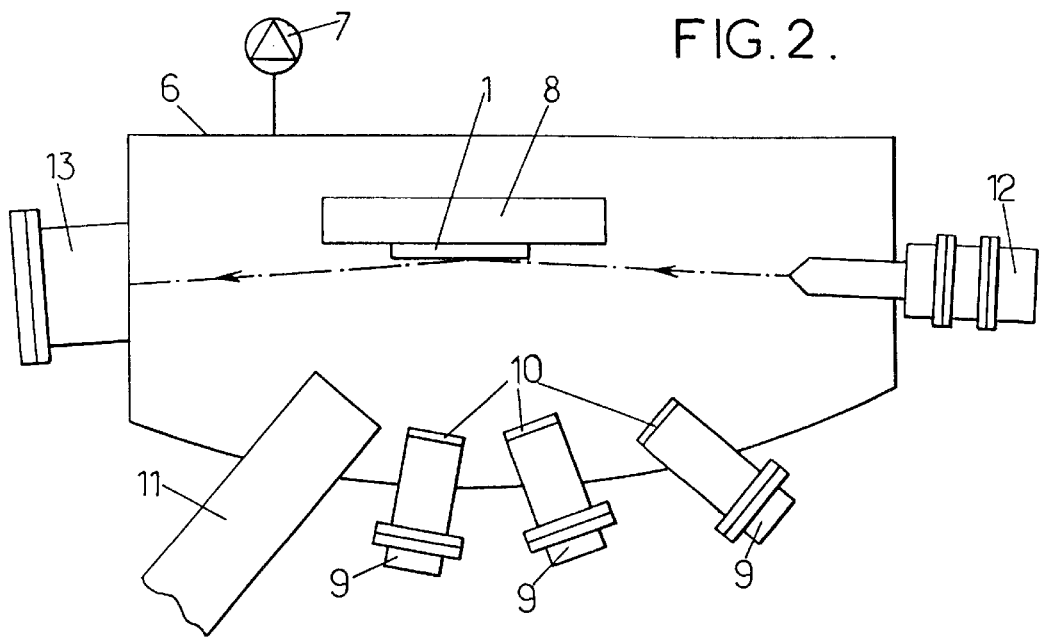
FIG. 2 is a schematic view of an apparatus making it possible to implement the method according to the invention.

For this purpose, as represented in FIG. 2, the substrate 1 is arranged on a heating support 8, in a vacuum chamber 6 connected to a vacuum pump 7 capable of producing a powerful vacuum.

The heating support heats the substrate 1 to a temperature below 600° C., and preferably to a temperature between 300 and 600° C., in particular between 300 and 550° C., for example between 300 and 500° C.

The vacuum chamber 6 includes a plurality of Knudsen cells, each cell 9 including, in the conventional way, a batch of an element to be evaporated, heating means for evaporating this element into the vacuum chamber, and an aperture which leads into the vacuum chamber and can be closed off by a cover 10. Once in the vapor form in the vacuum chamber, the evaporated element condenses on the walls which it encounters and, in particular, on the substrate 1. As used in this context, the term "evaporate" indicates that atoms or groups of atoms leave the batch contained in the Knudsen cell under the effect of an input of energy, then travel a certain distance in the vacuum chamber before depositing on the substrate 1.

In the example represented, the device includes three cells 9, respectively making it possible to evaporate copper, calcium and bismuth.

For each cell 9, closing the cover 10 makes it possible to prevent the vapors of the element heated in said cell 9 from entering the vacuum chamber. It is furthermore possible to adjust the heating power in each cell. This makes it possible to preadjust the evaporation rate of the material contained in each cell, and therefore the atomic flux of this material arriving on the substrate 1 or on a layer already deposited on the substrate 1.

The heating power of each Knudsen cell 9 is furthermore preadjusted so that the atom flux output by the various Knudsen cells 9 in operation at a given instant is between $10^{12}$ and $10^{15}$ atoms/$cm^2$.s, in particular between $10^{12}$ and $10^{14}$ atoms/$cm^2$.s and preferably close to $10^{13}$ atoms/$cm^2$.s, which substantially corresponds to the production of one layer in 100 seconds.

The device furthermore includes an atomic oxygen source 11 which may, for example, be the OPS source (oxygen plasma source) marketed by the company Riber (France).

In order to produce layers which include oxygen, the molecular oxygen source 11 creates a local atomic oxygen pressure of between $10^{-6}$ and 10 Pa, in particular between $10^{-6}$ and 1 Pa, for example between $10^{-4}$ and $10^{-3}$ Pa, in the vicinity of the substrate 1.

Furthermore, in the illustrative embodiments of the method for producing the material according to the invention, the atomic oxygen source used produced a local molecular oxygen pressure substantially equal to 10 times the local atomic oxygen pressure.

Finally, the device includes a reflection high-energy electron diffraction (RHEED) system, this system including an electron gun 12 capable of accelerating an electron beam at an energy which may, for example, be 35 kev, and a fluorescent screen 13.

During the production of each monomolecular layer of the superconducting film, the cover or covers 10 of the Knudsen cells 9 corresponding to the elements to be deposited in said layer are open and the others remain closed. The cells are continuously heated, only the covers 10 making it possible to interrupt the deposition.

For example, in order to produce a cuprate semiconducting layer 4, only the cover 10 of the Knudsen cell 9 containing copper is opened.

In order to produce an intermediate layer 5, the cover 10 of the Knudsen cell 9 containing calcium is opened. The cover 10 of the Knudsen cell 9 containing bismuth is, if appropriate, also opened if x is not equal to 0. The heating powers of the two Knudsen cells containing calcium and bismuth are preadjusted so that the total flux of calcium and bismuth atoms arriving on the last layer deposited is between $10^{12}$ and $10^{15}$ and, in particular, between $10^{12}$ and $10^{14}$ atoms/$cm^2$.s, in particular and in order to respect the desired ratio between bismuth and calcium.

The atomic oxygen source 11 operates in all cases. Furthermore, in order to deposit a layer 2, the cover 10 of the Knudsen cell 9 containing calcium is opened.

Similarly, in order to produce a layer 3, the cover 10 of the Knudsen cell 9 containing bismuth is opened.

The screen 13 is monitored during the deposition of each monoatomic layer.

This monitoring firstly makes it possible to detect any possible formation of three-dimensional aggregates which might take place in spite of the precautions taken. Such aggregate formation is detected by the appearance of points on the screen. In this case, the manufacture of the superconducting film is stopped and the started film is rejected.

Figure 3:
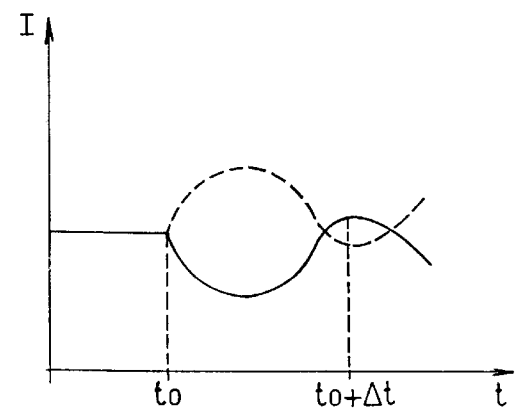
FIG. 3 is a view representing the change over time of the intensity of a RHEED electric diffraction line during the deposition of a monomolecular layer.

Furthermore, the screen 13 normally shows a network of parallel luminous lines which we will refer to in this context as "diffraction lines", the specular luminous intensity I of which is measured over time, as represented in FIG. 3. Thus, at the start of the production of a new layer, beginning at a time to, a drop in the intensity I generally results, and this intensity firstly passes through a minimum and then reaches a maximum at a time $t_{o+\Delta t}$ (solid curve). The intensity I may possibly firstly pass through a maximum and then reach a minimum at $t_{o+\Delta t}$ (broken curve).

According to the invention, the covers 10 of the Knudsen cells operating in order to produce this layer are closed at time $t_{o+\Delta t}$, and the atomic oxygen source is also stopped at this instant.

This prevents the formation of three-dimensional atom aggregates due to an excess of material relative to the minimum quantity required for obtaining a mono-molecular layer.

After production of the complete superconducting film, this film is removed from the vacuum chamber 6, then preferably heated for a few minutes, for example to 100° C., and in general to less than 300° C., under a molecular oxygen atmosphere or another oxidizing atmosphere at a pressure of more than 100 Pa, for example a pressure of one atmosphere.

The method according to the invention is not limited to the example described, but rather encompasses all variants thereof, in particular those in which:

the molecular beams are obtained no longer using Knudsen cells but by heating a material with an electron gun, or by laser ablation, the support 8 is not a heating support, and only the surface of the substrate or of the last layer deposited is heated, for example by a laser beam or other means.

I claim:

1. A method of vacuum depositing on a host surface, a superconducting material comprising a plurality of mutually superposed monomolecular layers, wherein adjacent monomolecular layers of said plurality of monomolecular layers have different chemical compositions and are deposited successively one after the other, each of said monomolecular layers comprising oxygen and at least one element chosen from the group consisting of: Ca, Cu, Bi, Tl, Hg, Sr, and the lanthanide series, said method including the steps of heating the host surface to a predetermined temperature below 660° C. and vacuum evaporating said at least one element in order to deposit each of said monomolecular layers on the host surface, while incorporating oxygen in each of said monomolecular layers by creating a local atomic oxygen pressure between $10^{-5}$ and 10 Pa and a local molecular oxygen pressure between $10^{-4}$ and 100 Pa in the vicinity of the host surface, the total atomic flux of said at least one element arriving on said host surface being between $10^{12}$ and $10^{15}$ atoms/cm.s, wherein the deposition of each of said monomolecular layers is monitored in real time by reflection high-energy electron diffraction, while measuring the intensity of the electron diffraction lines, and stopping the vacuum evaporation of said at least one element when the complete deposition of each of said monomolecular layers is detected, said complete deposition of each of the monomolecular layers being detected when said intensity reaches a second extremum after passing through a first extremum during the deposition of each of said monomolecular layers.

2. The method according to claim 1, in which the predetermined temperature of the host surface is at least equal to 300° C.

3. The method according to claim 1, including a final step of heating the host surface and the material deposited thereon under an oxidizing atmosphere.

4. The method according to claim 3, in which the final step of heating takes place to a temperature between 100° C. and 300° C.

* * * * *

UNITED STATES PATENT AND TRADEMARK OFFICE
CERTIFICATE OF CORRECTION

PATENT NO. : 5,827,802
DATED : October 27, 1998
INVENTOR(S) : LAGUES

It is certified that error appears in the above-indentified patent and that said Letters Patent is hereby corrected as shown below:

Title page, Item [73], assignee should read:

--[73] Assignees: Michel LAGUES, Fontenay-aux-Roses, FRANCE;
Jacques LEWINER, Saint-Cloud, FRANCE;
UFINNOVA, Paris, FRANCE--

Signed and Sealed this

Twenty-fourth Day of August, 1999

*Attest:*

Q. TODD DICKINSON

*Attesting Officer*     *Acting Commissioner of Patents and Trademarks*